(12) United States Patent
Yamada et al.

(10) Patent No.: US 6,438,041 B1
(45) Date of Patent: Aug. 20, 2002

(54) NEGATIVE VOLTAGE REGULATION

(75) Inventors: Shigekazu Yamada; Colin S. Bill, both of Cupertino, CA (US)

(73) Assignees: Advanced Micro Devices, Inc., Sunnyvale, CA (US); Fujitsu Limited, Kanagawa (JP)

(*) Notice: Subject to any disclaimer, the term of this patent is extended or adjusted under 35 U.S.C. 154(b) by 0 days.

(21) Appl. No.: 09/668,100

(22) Filed: Sep. 22, 2000

Related U.S. Application Data
(60) Provisional application No. 60/184,572, filed on Feb. 24, 2000.

(51) Int. Cl.[7] .................................................. G11C 7/00
(52) U.S. Cl. ........................... 365/189.09; 365/189.06; 365/185.3; 365/185.22; 365/185.2
(58) Field of Search ................. 365/189.09, 189.06, 365/185.2, 185.22, 185.3

(56) References Cited

U.S. PATENT DOCUMENTS

| | | | |
|---|---|---|---|
| 5,168,174 A | * 12/1992 | Naso et al. ............... 307/296.6 |
| 5,686,860 A | * 11/1997 | Matya ........................ 327/540 |
| 6,055,186 A | * 4/2000 | Hung et al. ............ 365/185.18 |
| 6,166,968 A | * 12/2000 | Song ..................... 365/189.09 |

* cited by examiner

*Primary Examiner*—David Nelms
*Assistant Examiner*—Connie C. Yoha
(74) *Attorney, Agent, or Firm*—Wagner Murabito & Hao LLP

(57) ABSTRACT

The present invention discloses a voltage regulation method and system that provides a predetermined erase voltage to at least one wordline during a negative gate stress mode. A low-supply voltage negative charge pump is activated to generate a relatively high negative voltage. The relatively high negative voltage is regulated to the predetermined erase voltage by a regulator circuit. Regulation of the relatively high negative voltage is based on a variable reference voltage that is generated by a reference voltage circuit and directed to the regulator circuit. The predetermined reference voltage is capable of being varied within a first predetermined voltage range, thereby varying the predetermined erase voltage. The predetermined erase voltage is transferred to the wordlines by at least one decoder circuit during an erase operation.

24 Claims, 6 Drawing Sheets

NEGATIVE VOLTAGE REGULATION

This application claims the benefit under 35 U.S.C. §119(e) of Provisional U.S. patent application Ser. No. 60/184,572, filed on Feb. 24, 2000.

FIELD OF INVENTION

The present invention relates generally to non-volatile memory devices and, more particularly, to a method and system of varying the regulated voltage supplied during erase in flash electrically erasable programmable read-only memory (EEPROM) devices.

BACKGROUND OF THE INVENTION

Flash memories are popular memory storage devices because they store information in the absence of continuous power and are capable of being constructed in a very compact form. Flash memory is typically constructed by fabricating a plurality of floating-gate transistors in a silicon substrate. A floating-gate transistor is capable of storing electrical charge on a separate gate electrode, known as a floating gate that is separated by a thin dielectric layer from a control-gate electrode. Generally speaking, data is stored in a non-volatile memory device by the storage of an electrical charge in the floating gate.

Flash memory is formed by rows and columns of flash transistors, with each transistor being referred to as a cell that includes a control gate, a drain and a source. A cell is typically programmed by applying a predetermined voltage to the control gate, a second predetermined voltage to the drain, and grounding the source. This causes channel hot electrons to be injected from the drain depletion region into the floating gate. A cell can be erased several ways in a flash memory device. In one arrangement, a cell is erased by applying a predetermined voltage to the source and he control gate and allowing the drain to float. This causes the electrons that were injected into the floating gate during programming to be removed by Fowler-Nordheim tunneling from the floating gate through the thin tunnel oxide layer to the source.

The predetermined voltage applied to the control gate of the cells during an erase operation can be a negative voltage that is generated from a supply voltage (Vcc) using a charge pump. The charge pump is well known in the art as a circuit capable of receiving a relatively small magnitude of input voltage and generating a relatively larger magnitude of positive or negative voltage as an output. The negative voltage generated during the erase operation by the charge pump is typically regulated to a predetermined voltage using some type of comparator. Comparators are also well known in the art as a circuit capable of comparing two variables and providing a predetermined control output indicating the difference between the variables.

In the prior art, the regulation of the negative voltage was fixed such that regulation was to a predetermined negative voltage. Known problems occur during the fabrication stages of the flash memory when it is desirable to vary the predetermined negative voltage generated during erase to test and characterize the cells. Testing and characterization includes identifying the characteristics of cell function, determining the unselected cell disturb during erase and determining the erase speed of the cells. The unselected cell disturb during erase is used to determine if the cells that are not selected to be erased are affected by the predetermined voltages applied during erase. Since the predetermined negative voltage cannot be easily varied in the prior art, testing and characterization of the cells is difficult and time-consuming.

To that end, a need exists for methods and systems that can be used to easily vary the regulation of the negative voltage generated during erase of the cells in a memory device.

SUMMARY OF THE INVENTION

The present invention discloses a method of generating a predetermined erase voltage in a memory device that overcomes the problems associated with the prior art. In the preferred embodiment, the memory device is a flash memory that includes a reference voltage circuit, a regulator circuit, a low-supply voltage negative charge pump, at least one decoder circuit and at least one wordline. The reference voltage circuit is electrically connected with the regulator circuit. The regulator circuit is electrically connected with a negative potential line (NEGP) that electrically connects the low-supply voltage negative charge pump with the decoder circuits. The decoder circuits are electrically connected with the wordlines.

During operation of the preferred flash memory in a negative gate stress mode, a variable reference voltage is generated with the reference voltage circuit. The variable reference voltage is generated by an external power supply whose output can be manually varied in a first predetermined voltage range. The variable reference voltage is directed to the regulator circuit, which generates a predetermined initializing voltage in response to the variable reference voltage. The initializing voltage is stored in a plurality of capacitors within the regulator circuit.

When an erase is initiated during the negative gate stress mode, the regulator circuit that has been previously initialized by the variable reference voltage is electrically isolated from the reference voltage circuit. The low-supply voltage negative charge pump is activated to generate and direct a relatively high negative voltage to the negative potential line (NEGP). The relatively high negative voltage present on the negative potential line (NEGP) is regulated by the regulator circuit to a predetermined erase voltage based on the variable reference voltage. The predetermined erase voltage is directed to the decoder circuits that are activated to transfer the predetermined erase voltage to a plurality of wordlines.

Regulation of the relatively high negative voltage occurs when the low-supply voltage negative charge pump is pumping the magnitude of voltage on the negative potential line (NEGP) down to the relatively high negative voltage. Since the capacitors within the regulator circuit are electrically connected with the negative potential line (NEGP), as the magnitude of voltage is pumped more negative by the low-supply voltage negative charge pump, the capacitors are correspondingly discharged. When the capacitors are discharged to about zero volts, a supply voltage connection (Vcc) is electrically connected with the negative potential line (NEGP) by the regulator circuit. The regulator circuit acts as a shunt regulator such that the additional current produced by the low-supply voltage negative charge pump after the capacitors are discharged is pulled up to the supply voltage connection (Vcc). The magnitude of the predetermined erase voltage is thereby prevented from being pumped further negative.

Since the variable reference voltage supplied from the reference voltage circuit determines the predetermined erase voltage, variation of the variable reference voltage within the first predetermined voltage range will produce different predetermined erase voltages. When an erase operation begins, the variable reference voltage circuit has previously initialized the regulator circuit with the variable reference voltage and the regulator circuit is electrically isolated from the reference voltage circuit. As such, the only discharge path for the capacitors that are charged to the initializing voltage is through the negative potential line (NEGP).

Another preferred embodiment of the present invention is a voltage regulation system for use during an erase operation in a memory device that, in the preferred embodiment, is a flash memory. During operation in a negative gate stress mode, when an erase operation is initiated, a low-supply voltage negative charge pump generates a relatively high negative voltage. A regulator circuit that is electrically connected with the low-supply voltage negative charge pump regulates the relatively high negative voltage to a predetermined erase voltage. The predetermined erase voltage is then transferred to a plurality of wordlines. The predetermined erase voltage is based on a variable reference voltage generated by a reference voltage circuit electrically connected with the regulator circuit. The variable reference voltage initializes the regulator circuit to control the regulation of the predetermined erase voltage in a similar fashion to the previously set forth preferred embodiment.

The ability to vary the initializing voltage allows a plurality of cells within the wordlines of the flash memory to be characterized by using different predetermined erase voltages to perform the erase operation. In prior art memory devices, the initializing voltage cannot be easily varied and therefore characterization of the erase speed, the unselected cell erase disturb and other operating parameters is difficult. Using the preferred embodiment of the present invention, the previously time-consuming and difficult task of testing or adjusting the cell function is accomplished quickly and easily.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made on the specific configurations while remaining within the scope of the claims. The invention may be used with any type of memory device that includes an electrical erase operation; however, the preferred embodiment of the invention is designed for a flash memory.

All electrical parameters are given by example only and could be modified for use with various memory devices using other electrical parameters. For example, in the preferred embodiment, a supply voltage (Vcc) is considered as 3.6 V, but could alternatively be 5.0 V, 1.8 V or some other supply voltage. If a different supply voltage is chosen, the various operational levels would be modified to accommodate the different supply voltage as known in the art.

Figure 1:
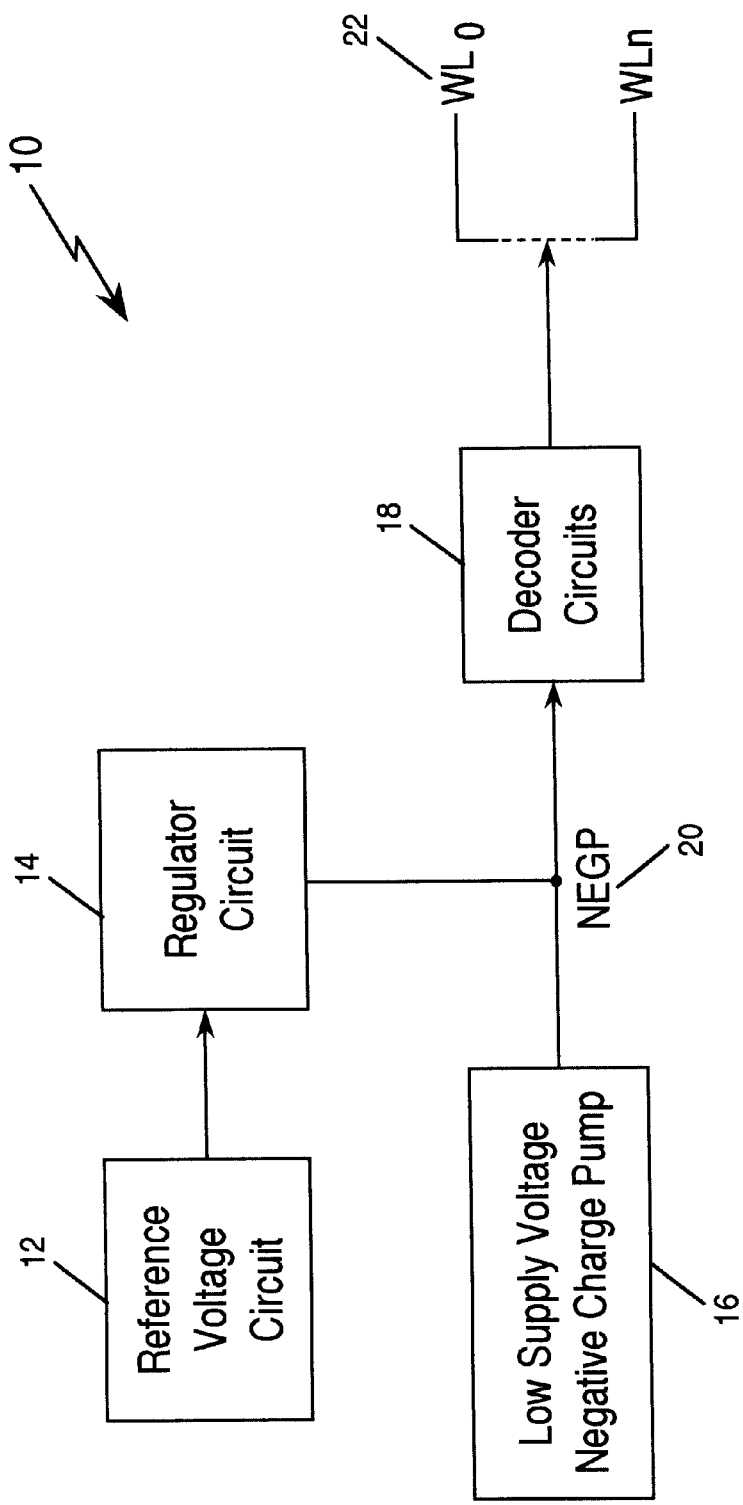
FIG. 1 represents a block diagram of a portion of a preferred flash memory incorporating a preferred embodiment of the invention.

FIG. 1 illustrates a portion of a preferred flash memory 10 incorporating an embodiment of the present invention. The flash memory 10 includes a reference voltage circuit 12, a regulator circuit 14, a low-supply voltage negative charge pump 16, at least one decoder circuit 18, a negative potential line (NEGP) 20 and at least one wordline 22. In the preferred embodiment of the present invention, the reference voltage circuit 12 is electrically connected with the regulator circuit 14. The low-supply voltage negative charge pump 16 is electrically connected with the decoder circuits 18 by the negative potential line (NEGP) 20. The regulator circuit 14 is electrically connected with the negative potential line (NEGP) 20 to regulate voltage generated by the low-supply voltage negative charge pump 16 that is directed to the decoder circuits 18. The decoder circuits 18 are electrically connected with the wordlines 22.

In the preferred embodiment, when an erase operation is performed, the regulator circuit 14, the low-supply voltage negative charge pump 16 and the decoder circuits 18 receive control signals from a state machine (not shown). As known in the art, state machines are used to control the overall operation of the flash memory 10 in response to instruction sets that are received by the state machine. In the preferred embodiment, it is only necessary to understand that the state machine generates predetermined control signals that are directed to the regulator circuit 14, the low-supply voltage negative charge pump 16 and the decoder circuits 18.

The low-supply voltage negative charge pump 16 is activated to generate a relatively high negative voltage by the predetermined control signals from the state machine. For a detailed discussion of the low-supply voltage negative charge pump 16, see U.S. Pat. No. 5,973,979 entitled "LOW-SUPPLY VOLTAGE NEGATIVE CHARGE PUMP," which is herein incorporated by reference in its entirety. In general, the low-supply voltage negative charge pump 16 receives a magnitude of input voltage that is channeled through a series of capacitive stages to generate the relatively high negative voltage.

The relatively high negative voltage generated at the output of the low-supply voltage negative charge pump 16 is directed to the negative potential line (NEGP) 20 where it is regulated by the regulator circuit 14 to a predetermined erase voltage. In the preferred embodiment, the magnitude of the predetermined erase voltage is between about –6 V and –7.7 V. Since the decoder circuits 18 are connected with the negative potential line (NEGP) 20, the predetermined erase voltage is directed to the decoder circuits 18. The decoder circuits 18 are activated by the state machine to transfer the predetermined erase voltage to the wordlines 22. As known in the art, fundamental components of any memory device are decoder circuits and a variety of decoder circuits exist that could be used to make up the decoder circuits 18.

In general, decoder circuits output an electric signal if all of the bits of an address input correspond to a predetermined set of values. For purposes of the present invention, it is only necessary for those skilled in the art to understand that the decoder circuits 18 are activated by the state machine to transfer the predetermined erase voltage to the wordlines 22 during an erase operation. Those skilled in the art would understand that the erase operation is used to erase cells in the wordlines 22.

During a negative gate stress mode, the regulation of the relatively high negative voltage by the regulator circuit 14 is based on a variable reference voltage generated by the reference voltage circuit 12. The variable reference voltage initializes the regulator circuit 14 before the regulator circuit 14 is activated to regulate the relatively high negative voltage. The magnitude of the variable reference voltage generates a predetermined initializing voltage that controls the corresponding magnitude of the predetermined erase voltage. By varying the variable reference voltage during the initialization of the regulator circuit 14, the magnitude of the predetermined erase voltage can be controlled during the subsequent erase operation. Control of the predetermined erase voltage during the negative gate stress mode allows characterization and testing of the flash memory 10. Those skilled in the art would understand that characterization and testing provides erase speed, unselected cell erase disturb levels and other operating parameters associated with the erase operation.

Figure 2:
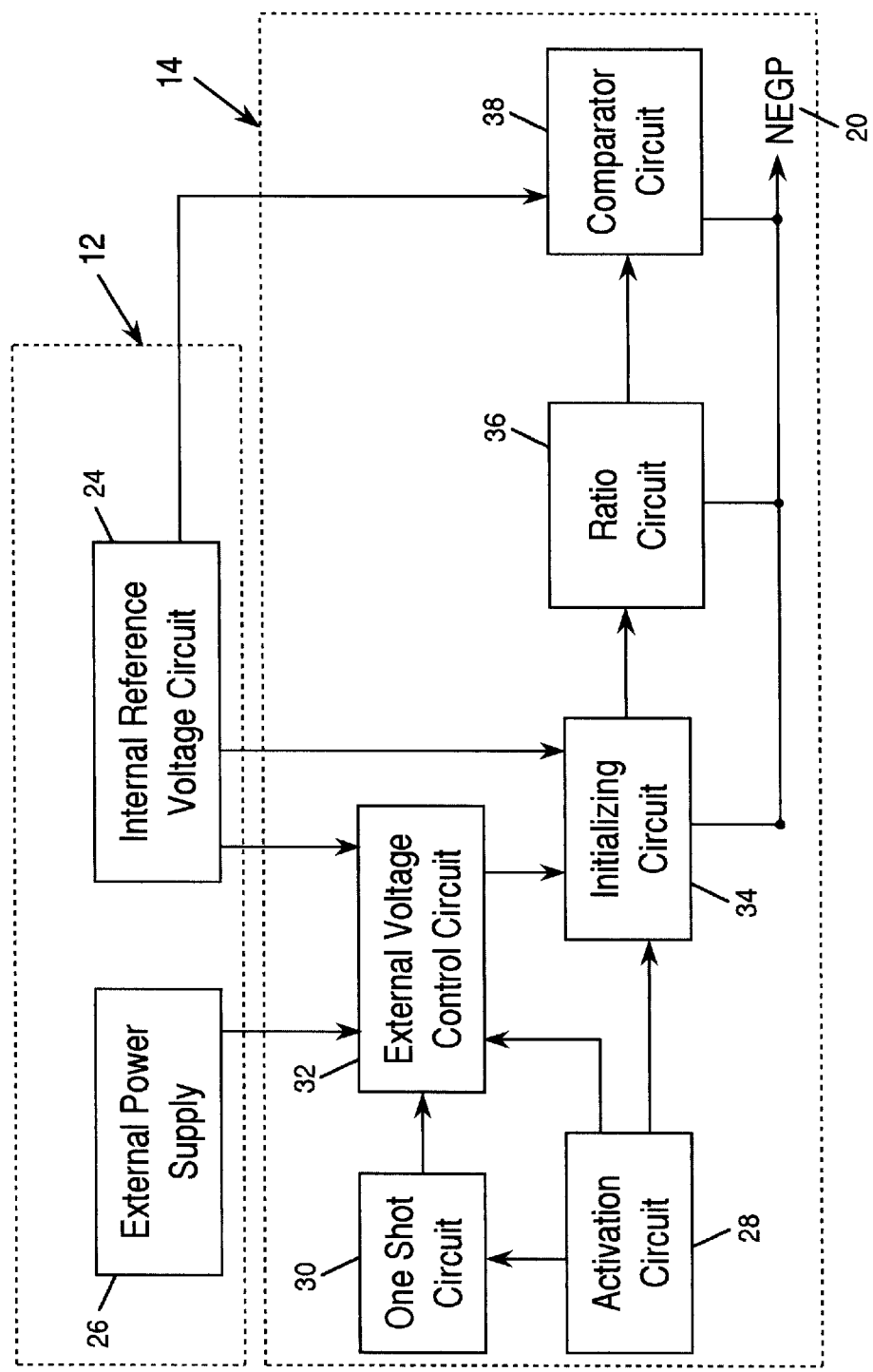
FIG. 2 is an expanded block diagram of the preferred reference voltage circuit and the preferred regulator circuit illustrated in FIG. 1.

FIG. 2 illustrates an expanded block diagram of the reference voltage circuit 12 and the regulator circuit 14 depicted in FIG. 1. The preferred reference voltage circuit 12 includes an internal reference voltage circuit 24 and an external power supply 26 electrically connected to the regulator circuit 14 as illustrated. The preferred regulator circuit 14 includes an activation circuit 28, a one-shot circuit 30, an external voltage control circuit 32, an initializing circuit 34, a ratio circuit 36 and a comparator circuit 38 that are electrically connected as illustrated in FIG. 2.

The internal reference voltage circuit 24 generates a predetermined reference voltage during embedded mode operation and also during the negative gate stress mode. Embedded mode operation of the flash memory 10 is the standard operating mode where operations, such as the erase operation, occur in an automated fashion. The predetermined reference voltage is used during the embedded mode to initialize the regulator circuit 14. During the negative gate stress mode, the predetermined reference voltage acts as a control voltage as detailed below. The preferred predetermined reference voltage of about 1.3 V is generated from a supply voltage (Vcc) (not shown). The internal reference voltage circuit 24 could be designed in a variety of ways to produce the desired regulated predetermined reference voltage.

The external power supply 26 supplies the predetermined variable voltage used during the negative gate stress mode to initialize the regulator circuit 14. The preferred predetermined variable voltage is generated by an external power supply and can be manually varied within a first predetermined voltage range of about 0.7 V to 1.2 V. Those skilled in the art would recognize that the range of the predetermined variable voltage may be any range necessary to properly characterize and test the flash memory 10 during the erase operation. As such, the first predetermined voltage range of the preferred embodiment should not be construed as a limitation on the present invention. In addition, the use of an external power supply in the preferred embodiment should not be construed as a limitation of the present invention since power supplies internal to the flash memory 10 are also possible. The external power supply 26 could be any of a variety of widely known power supplies that are capable of providing a variable voltage output.

Figure 3:
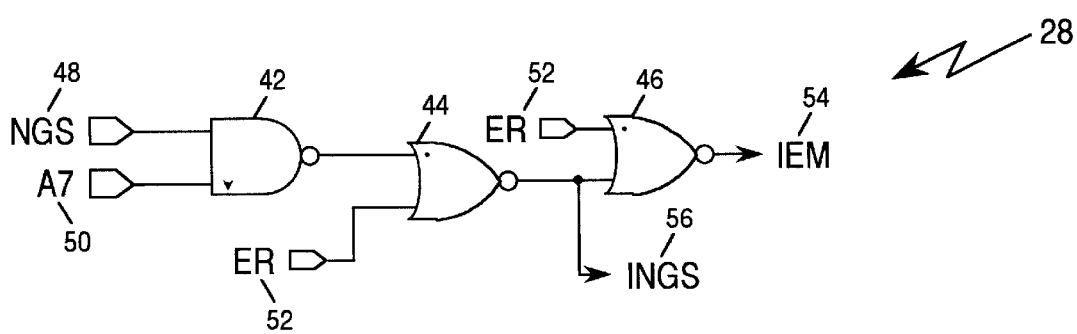
FIG. 3 is a circuit schematic of the preferred activation circuit of the present invention.

FIG. 3 illustrates a circuit schematic representing the preferred activation circuit 28. The activation circuit 28 includes a NAND gate 42 and a plurality of NOR gates 44–46 that is electrically connected as illustrated. The activation circuit 28 is directed by predetermined electric signals on a negative gate stress line (NGS) 48, an address seven line (A7) 50 and an erase line (ER) 52 to activate the regulator circuit 14. The predetermined electric signals are provided by the state machine (not shown) during embedded mode and negative gate stress mode to direct the activation circuit 28 to activate the one-shot circuit 30, the external voltage control circuit 32 and the initializing circuit 34.

The state machine generates a conducting electric signal on the negative gate stress line (NGS) 48 when the flash memory 10 is in the negative gate stress-mode. The address seven line (A7) 50 is non-conducting when the predetermined reference voltage is supplied from the internal reference voltage circuit 24 and is conducting when the variable reference voltage is supplied from the external power supply 26. The erase line (ER) 52 begins conducting when an erase is performed following initialization of the regulator circuit 14 with the predetermined reference voltage or the variable reference voltage.

Although the preferred embodiment of the present invention concerns the negative gate stress mode, a discussion of the embedded mode operation is helpful to fully understand the negative gate stress mode. During the embedded mode, the regulator circuit 14 is initialized when the negative gate stress line (NGS) 48, the address seven line (A7) 50 and the erase line (ER) 52 are non-conducting and an initiate embedded mode line (IEM) 54 is conducting. In addition, an initiate negative gate stress line (INGS) 56 is non-conducting. When the state machine receives instruction sets to perform an erase operation, the erase line (ER) 52 begins conducting such that the initiate embedded mode line (IEM) 54 becomes non-conducting and the initiate negative gate stress line (INGS) 56 remains non-conducting. During the negative gate stress mode, the regulator circuit 14 is initialized when the negative gate stress line (NGS) 48 and the address seven line (A7) 50 are conducting and the erase line (ER) 52 is non-conducting.

Figure 4:
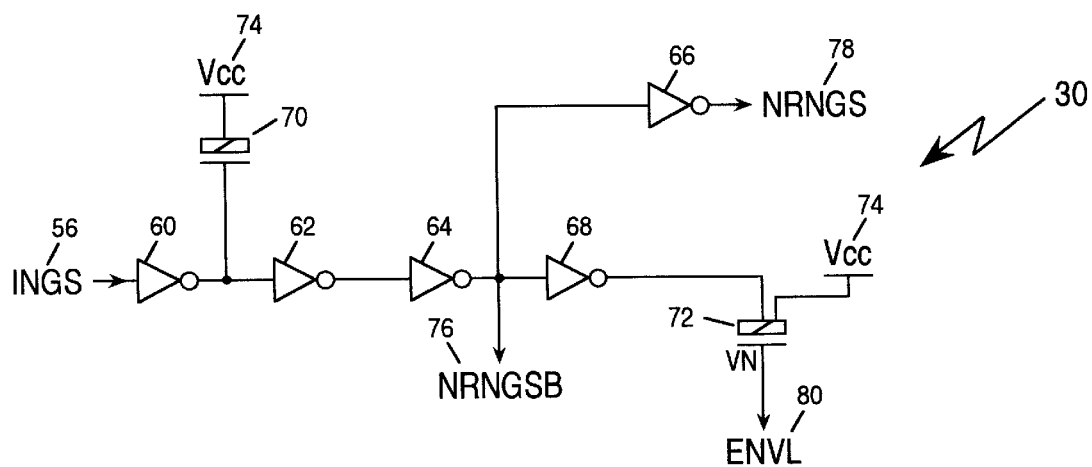
FIG. 4 is a circuit schematic of the preferred one-shot circuit of the present invention.

FIG. 4 illustrates a circuit schematic representing the preferred one-shot circuit 30. The one-shot circuit 30 includes a plurality of inverters 60–68 and a plurality of p-channel capacitors 70–72 that are electrically connected as illustrated in FIG. 4. The preferred one-shot circuit 30 is also electrically connected to a supply voltage connection (Vcc) 74 as illustrated. A control input is directed to inverter 60 on the initiate, negative gate stress line (INGS) 56 from the activation circuit 28. The one-shot circuit 30 provides a plurality of predetermined time delays of the control input. Those skilled in the art would recognize that several variations in one-shot circuits may be used in the present invention and the preferred one-shot circuit 16 should not be construed as a limitation.

The one-shot circuit 30 provides a first control output on a bar negative gate stress line (NRNGSB) 76 that is the non-inverted control input, subjected to a first predetermined time delay. Similarly, a second control output is provided on a regulate negative gate stress line (NRNGS) 78 that is the inverted control input subjected to a second predetermined time delay. The other output of the one-shot circuit 30 is a third control output of a predetermined charging voltage. The predetermined charging voltage is supplied by p-channel capacitor 72 to an enable negative voltage line (ENVL) 80 that is electrically connected with the initializing circuit 34. The third control output is subject to a third predetermined time delay. In the preferred embodiment, p-channel capacitor 72 is capable of storing and discharging the predetermined charging voltage of about 2.5 V. Those skilled in the art would recognize that p-channel capacitor 72 provides additional time delay as well as the ability to act as a charge pump when the predetermined charging voltage is discharged to the enable negative voltage line (ENVL) 80.

Figure 5:
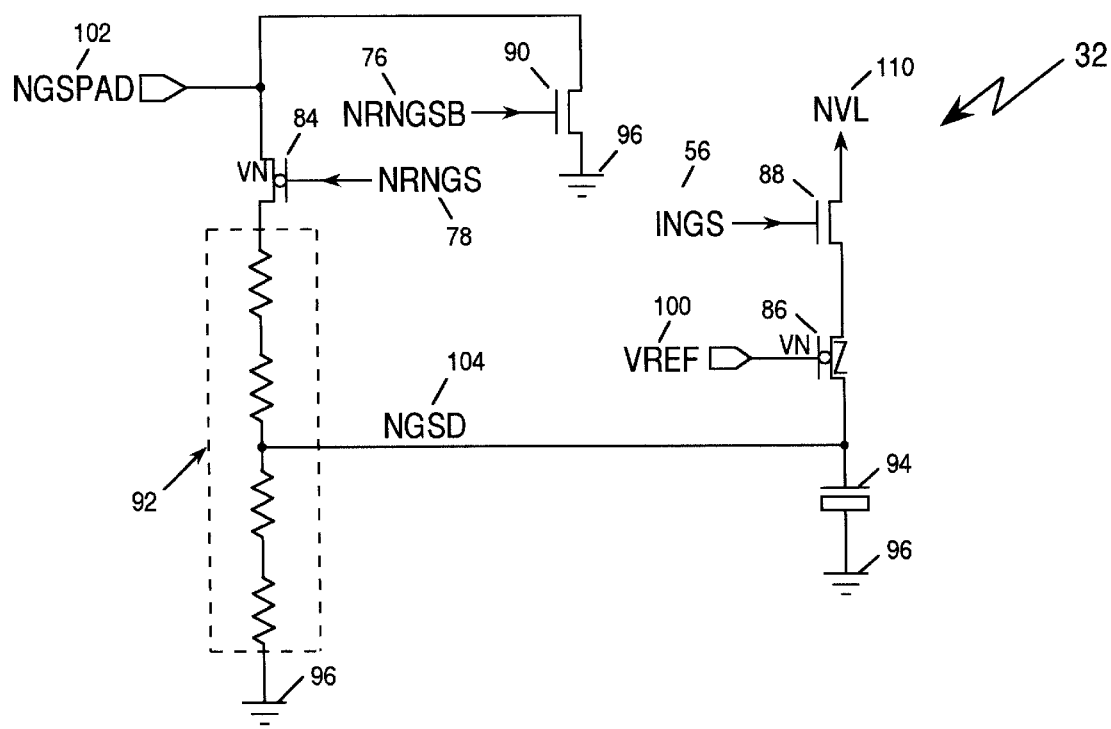
FIG. 5 is a circuit schematic of the preferred external voltage control circuit of the present invention.

FIG. 5 illustrates a circuit schematic representing the external voltage control circuit 32. The preferred external voltage control circuit 32 includes a low-threshold n-channel transistor 84, a z-device n-channel transistor 86, a plurality of n-channel transistors 88–90, a resistor chain 92, and an n-channel capacitor 94 that are electrically connected as illustrated in FIG. 5. The external voltage control circuit 32 is also electrically connected with a ground connection 96 as illustrated. In addition, the predetermined reference voltage and the variable reference voltage are supplied to the external voltage control circuit 32 by a respective reference voltage line (VREF) 100 and a negative gate stress pad line (NGSPAD) 102 that are electrically connected as illustrated in FIG. 5.

The external voltage control circuit 32 receives and conditions the variable reference voltage present on the negative gate stress pad line (NGSPAD) 102. The variable reference voltage is passed to either the resistor chain 92 or the ground connection 96 by the respective n-channel transistors 84 and 90 within the external voltage control circuit 32. Those skilled in the art would understand that the resistor chain 92 is a voltage divider created by a series of resistive devices configured to function as a series of resistors having a predetermined resistance.

The preferred resistor chain 92 generates a variable initializing voltage that is set to about eighty-three percent of the variable reference voltage on a negative gate stress divider node (NGSD) 104 in the preferred embodiment. Those skilled in the art would recognize that the resistor chain 92 and the n-channel capacitor 94 provide an RC delay in the external voltage control circuit 32. The RC delay minimizes any noise that may be present with the variable initializing voltage. The variable initializing voltage is passed to a negative voltage line (NVL) 110 through z-device n-channel transistor 86 that is activated by the predetermined reference voltage on the voltage reference line (VREF) 108 and n-channel transistor 88 that is activated by the activation circuit 28. The negative voltage line (NVL) 110 is electrically connected with the initializing circuit 34 to pass the variable initializing voltage to the initializing circuit 34.

Figure 6:
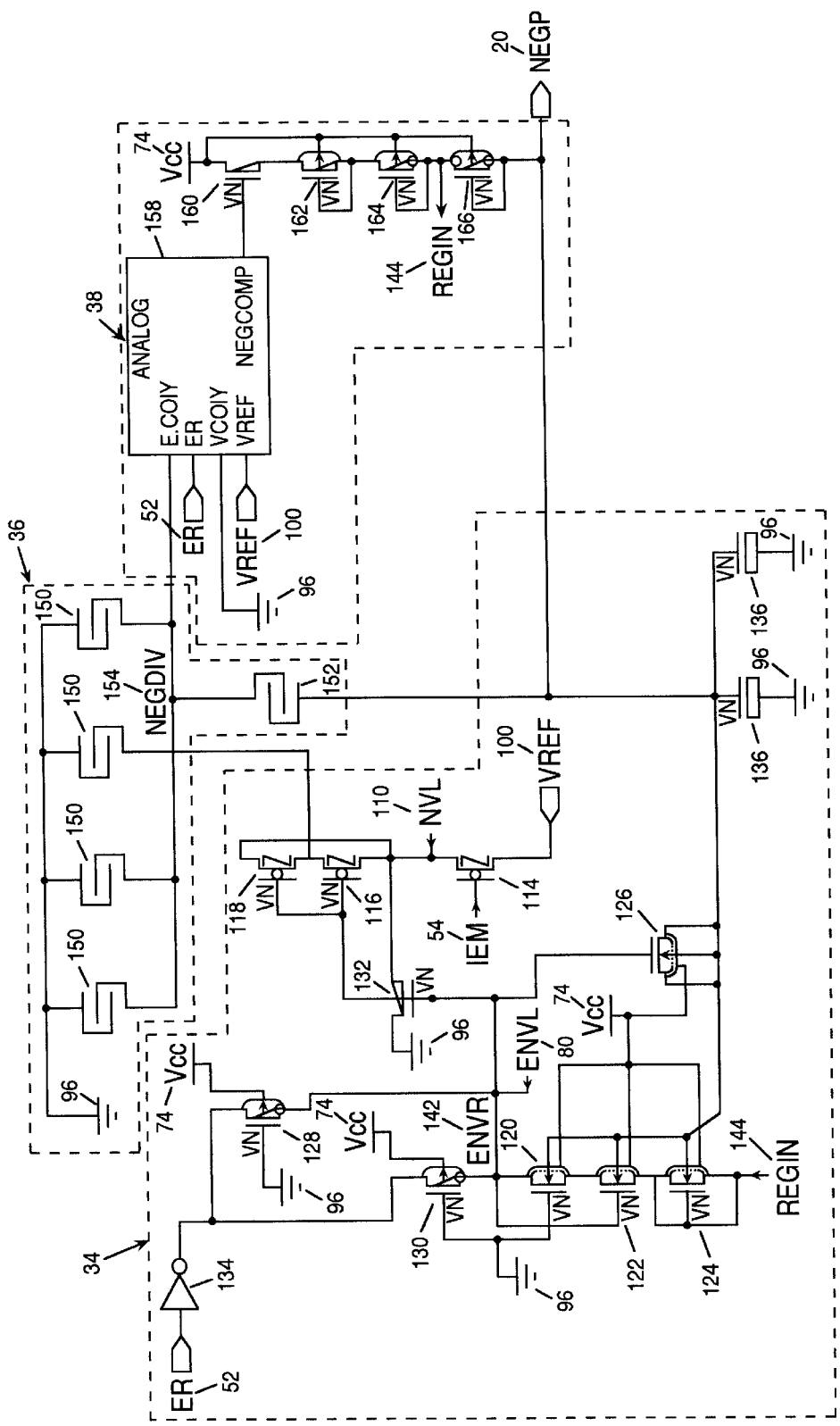
FIG. 6 is a circuit schematic of the preferred initializing circuit, the preferred ratio circuit and the preferred comparator circuit of the present invention.

FIG. 6 illustrates a circuit schematic of the initializing circuit 34, the ratio circuit 36 and the comparator circuit 38. The preferred initializing circuit 34 includes a plurality of z-device n-channel transistors 114–118, a plurality of triple-well n-channel transistors 120–126, a plurality of p-channel transistors 128–132, an inverter 134 and a plurality of n-channel capacitors 136 that are electrically connected as illustrated in FIG. 6. The initializing circuit 34 is also electrically connected with the supply voltage connection (Vcc) 74 and the ground connection 96 as illustrated.

The initializing circuit 34 transfers an initializing voltage that is the predetermined reference voltage or the variable initializing voltage to the ratio circuit 36 when activated. The variable initializing voltage is supplied to the initializing circuit 34 on the negative voltage line (NVL) 110 that is electrically connected with a negative voltage node (NVR) 140 as previously set forth. The predetermined reference voltage is supplied on the voltage reference line (VREF) 100 that is electrically connected with z-device n-channel transistor 114. Activation of z-device n-channel transistor 114 by the conducting initiate embedded mode line (IEM) 54 passes the predetermined reference voltage to the negative voltage node (NVR) 140. Either the predetermined reference voltage or the variable initializing voltage is transferred to the ratio circuit 36 as the initializing voltage when z-device n-channel transistors 116 and 118 are activated.

Z-device n-channel transistors 116 and 118 are activated by a conducting electric signal on an enable negative voltage node (ENVR) 142. The conducting electric signal on the enable negative voltage node (ENVR) 142 can be supplied by the enable negative voltage line (ENVL) 80 and by the erase line (ER) 52 via p-channel transistors 128 and 130. P-channel transistors 128 and 130 are activated to pass the inverted electric signal from the erase line (ER) 52 when the magnitude of voltage present on the enable negative voltage node (ENVR) 142 is higher than the ground connection 96. Those skilled in the art would recognize that the electrical connection of the substrate of p-channel transistors 128 and 130 with the supply voltage connection (Vcc) 74 maintains a negative bias condition.

P-channel transistors 128 and 130 are formed to provide a predetermined high breakdown voltage limit. The predetermined high breakdown voltage limit will allow exposure to the predetermined high negative voltages on the enable negative voltage node (ENVR) 142 without causing junction breakdown. Junction breakdown occurs when the potential between the source and the control gate of a respective transistor reaches a predetermined magnitude of voltage that damages the oxide of the transistor. In the preferred embodiment, the enable negative voltage node (ENVR) 142 is exposed to predetermined high negative voltages during the negative gate stress mode as set forth below.

Z-device n-channel transistors 116 and 118 are deactivated by a non-conducting electric signal that is directed to the enable negative voltage node (ENVR) 142 by a conducting electric signal on the erase line (ER) 52. When z-device n-channel transistors 116 and 118 are deactivated, p-channel transistor 132 remains deactivated due to the magnitude of voltage remaining on the enable negative voltage node (ENVR) 142. In the preferred embodiment, the voltage present on the enable negative voltage node (ENVR) 142 when the erase line (ER) 52 is conducting is about 0.5 V.

The z-device n-channel transistors 114, 116 and 118 are formed with a threshold voltage that is approximately zero volts. Those skilled in the art would understand that the ability of a transistor to remain deactivated is a function of the transistor's threshold voltage. In addition, continued deactivation of the transistor depends on a back bias provided by the difference in potential between the voltage applied to the source and the control gate of the respective transistor. When the magnitude of voltage at the source of z-device n-channel transistors 116 and 118 approaches zero volts, deactivation is maintained by applying a first predetermined back bias voltage. In the preferred embodiment, the first predetermined back bias voltage of about −2 V is applied to the control gate of z-device n-channel transistors 116 and 118.

The first predetermined back bias voltage is directed to the enable negative voltage node (ENVR) 142 on the enable negative voltage line (ENVL) 80 by the one-shot circuit 30. The one-shot circuit 30 uses p-channel capacitor 72 as a charge pump as previously set forth. When the first predetermined back bias voltage is present on the enable negative voltage node (ENVR) 142, p-channel transistor 132 is activated to electrically connect the negative voltage node (NVR) 140 with the ground connection 96. In addition, triple-well n-channel transistors 120 and 122 are activated.

Triple-well n-channel transistors 120 and 122 transfer a second predetermined back bias voltage to the enable negative voltage node (ENVR) 142. The second predetermined back bias voltage is supplied on a regulation line (REGIN) 144 that is electrically connected with the comparator circuit 38. Those skilled in the art would recognize that the triple-well n-channel transistors 124 and 126 and the supply voltage connection (Vcc) 74 maintain the negative bias of triple-well n-channel transistors 120 and 122. Those skilled in the art would also recognize that the n-channel capacitors 136 eliminate transient voltage that may be present.

Referring again to FIG. 6, the preferred ratio circuit 36 includes a plurality of first capacitors 150 and a second capacitor 152 that are electrically connected as illustrated in FIG. 6. The ratio circuit 36 is also electrically connected to the ground connection 96 as illustrated. The preferred ratio circuit 36 provides storage for the initializing voltage supplied from the initializing circuit 34. When a magnitude of initializing voltage is directed from the initializing circuit 34 to a negative divider node (NEGDIV) 154, the first and second capacitors 150, 152 are charged to the magnitude of the initializing voltage. The first and second capacitors 150,152 are capacitors that allow charging with a predetermined low magnitude initializing voltage. The second capacitor 152 is grounded by electrically connecting the negative potential line BEGP) 20 with a ground connection (not shown) to allow the second capacitor 152 to be charged.

During the preferred erase operation, the negative divider node (NEGDIV) 154 is electrically isolated from the initializing circuit 34. In addition, the first and second capacitors 150, 152 have previously been charged to the initializing voltage when a magnitude of voltage is directed to the negative potential line (NEGP) 20. The first and second capacitors 150, 152 will discharge or be further charged to a magnitude of voltage that corresponds to the magnitude of voltage on the negative potential line (NEGP) 20. As the first and second capacitors 150, 152 charge and discharge, the magnitude of voltage at the negative divider node (NEGDIV) 154 will vary to correspond to the magnitude of voltage on the negative potential line (NEGP) 20. The first and second capacitors 150, 152 create a predetermined ratio between the magnitude of voltage present on the negative divider node (NEGDIV) 154 and the magnitude of voltage present on the negative potential line (NEGP) 20. The predetermined ratio can be calculated and adjusted by those skilled in the art. The magnitude of voltage present on the negative divider node (NEGDIV) 154 is monitored by the comparator circuit 38.

Referring again to FIG. 6, the preferred comparator circuit 38 includes an analog comparator 158 and a plurality of p-channel transistors 160–166 that are electrically connected as illustrated. The comparator circuit is also electrically connected with the supply voltage connection (Vcc) 74 and the ground connection 96 as illustrated. The preferred comparator circuit 38 monitors the negative divider node (NEGDIV) 154 and acts as a shunt regulator to provide regulation of the voltage present on the negative potential line (NEGP) 20.

A conducting electric signal on the erase line (ER) 52 and the predetermined reference voltage on the voltage reference line (VREF) 100 activate the analog comparator 158. The analog comparator 158 is known in the art as a standard differential amplifier that uses dual sensing to compare the magnitude of voltage present on the negative divider node (NEGDIV) 154 with the ground connection 96. When the magnitude of voltage present on the negative divider node (NEGDIV) 154 is less than or about equal to the magnitude of voltage present on the ground connection 96, p-channel transistor 160 is activated by the analog comparator 158.

Activation of p-channel transistor 160 electrically connects the supply voltage connection (Vcc) 74 to the negative potential line (NEGP) 20 through p-channel transistors 162, 164 and 166. P-channel transistors 162, 164 and 166 are electrically connected as diodes to provide a voltage drop between the supply voltage connection (Vcc) 74 and the negative potential line (NEGP) 20. The voltage drop prevents junction breakdown of p-channel transistor 160 due to the magnitude of negative voltage that may be present on the negative potential line (NEGP) 20. In addition, p-channel transistors 164 and 166 are formed to provide a predetermined high breakdown voltage limit due to the voltage on the negative potential line (NEGP) 20. Electrically connected between transistors 164 and 166 is the regulation line (REGIN) 144. The magnitude of voltage on the regulation line (REGIN) 144 will be equal to the magnitude of voltage present on the negative potential line (NEGP) 20 less the voltage drop from p-channel transistor 166.

Referring again to FIG. 2, during embedded mode, the predetermined reference voltage is generated by the internal reference voltage circuit 24 and directed to the regulator circuit 14 as previously set forth. The activation circuit 28 is directed by the state machine to activate the initializing circuit 34. Referring now to FIG. 5, z-device n-channel transistors 114, 116 and 118 of the initializing circuit 34 are activated to pass the predetermined reference voltage of about 1.3 V to the negative divider node (NEGDIV) 154. The predetermined reference voltage charges the first and second capacitors 150, 152 of the ratio circuit 36 to the initializing voltage of about 1.3 V, thereby initializing the regulator circuit 14.

When the state machine receives an instruction set containing an erase instruction, z-device n-channel transistors 114, 116 and 118 are deactivated. In addition, the low-supply voltage negative charge pump 16 is activated to supply the relatively high negative voltage on the negative potential line (NEGP) 20 as previously set forth. As the magnitude of voltage on the negative potential line (NEGP) 20 is pumped to the relatively high negative voltage, the first and second capacitors 150, 152 in the ratio circuit 36 are correspondingly discharged. Discharge of the first and second capacitors 150, 152 causes the magnitude of the initializing voltage at the negative divider node (NEGDIV) 154 to be correspondingly lowered.

When the magnitude of the initializing voltage at the negative divider node (NEGDIV) 154 reaches about zero volts, the analog comparator 158 of the comparator circuit 38 activates n-channel transistor 160. The current produced by the low-supply voltage negative charge pump 16 is thereby pulled up to the potential of the supply voltage connection (Vcc) 74. As a result, the relatively high negative voltage is regulated to a predetermined erase voltage of about −9V. The predetermined erase voltage is directed to the decoder circuits 18 on the negative potential line (NEGP) 20 and is, in turn, transferred to the wordlines 22 as previously set forth.

Referring again to FIG. 2, when the preferred flash memory 10 is in the negative gate stress mode, the external power supply 26 is manually adjusted to supply the variable reference voltage of between 0.7 V and 1.2 V. In addition, the internal reference voltage circuit 24 supplies the predetermined reference voltage of about 1.3 V to the external voltage control circuit 32, the initializing circuit 34 and the comparator circuit 38. Predetermined electric signals activate the one-shot circuit 30, the external voltage control circuit 32 and the initializing circuit 34 via the activation circuit 28 as previously set forth.

Referring now to FIG. 6, z-device n-channel transistor 114 of the initializing circuit 34 is deactivated, thereby electrically disconnecting the predetermined reference voltage from the initializing circuit 34. The one-shot circuit 30 is activated to provide the first, second and third control outputs as previously set forth. During the time between deactivation of z-device n-channel transistor 114 and generation of the first, second and third control outputs, z-device n-channel transistors 116 and 118 of the initializing circuit 34 remain activated. In addition, the initializing voltage present on the negative divider node (NEGDIV) 154 of the ratio circuit 36 is dissipated through the electrical connection of the negative potential line (NEGP) 20 with the ground connection (not shown).

Referring now to FIG. 5, at the conclusion of the first predetermined time delay, n-channel transistor 90 in the external voltage control circuit 32 is deactivated. At the conclusion of the second predetermined time delay, low-threshold n-channel transistor 84 in the external voltage control circuit 32 is activated. The predetermined variable voltage present on the negative gate stress pad line (NGSPAD) 102 is then passed to the resistor chain 92. The variable initializing voltage, which is in the range of about 0.6V to 1.0V depending on the magnitude of the predetermined variable voltage, is then generated and transferred to the initializing circuit 34. Referring now to FIG. 6, z-device n-channel transistors 116 and 118 pass the initializing voltage to the negative divider node (NEGDIV) 154 of the ratio circuit 36. First and second capacitors 150, 152 of the ratio circuit 36 are then charged to the initializing voltage that is in the range of about 0.6V to 1.0V.

When the state machine receives an instruction set containing an erase instruction, z-device n-channel transistors 116 and 118 of the initializing circuit 34 are deactivated by the conducting erase line (ER) 52. In addition, n-channel transistor 90 of the external voltage control circuit 32 depicted in FIG. 5 is activated and low-threshold n-channel transistor 84 is deactivated by the respective first and second control outputs from the one-shot circuit 30. Following electrical isolation of the negative divider node (NEGDIV) 154 from the negative voltage node (NVR) 140, the low-supply voltage negative charge pump 16 is activated to begin generation of the relatively high negative voltage on the negative potential line (NEGP) 20. As the low-supply voltage negative charge pump 16 pumps to the relatively high negative voltage, the initializing voltage present on the negative divider node (NEGDW) 154 is correspondingly lowered.

During pumping by the low-supply voltage negative charge pump 16, the one-shot circuit 30 generates the third control output. The third control output brings the enable voltage line (ENVL) 80 quickly down to about zero volts, thereby pumping the enable voltage node (ENVR) 142 to the first predetermined back bias voltage. The stronger back bias allows z-device n-channel transistors 116 and 118 to remain deactivated as the magnitude of the initializing voltage present on the negative divider node (NEGDIV) 154 is correspondingly lowered.

The first predetermined back bias voltage on the enable voltage node (ENVR) 142 activates p-channel transistors 120 and 122 to transfer the second predetermined back bias voltage to the enable voltage node (ENVR) 142 as previously set forth. The enable voltage node (ENVR) 142 is then driven to the second predetermined back bias voltage as the magnitude of the initializing voltage present on the negative divider node (NEGDIV) 154 approaches zero volts. Those skilled in the art would recognize that the second predetermined back bias voltage varies with the magnitude of voltage present on the negative potential line (NEGP) 20. Maintaining deactivation of the z-device n-channel transistors 116 and 118 ensures that the initializing voltage present on the negative divider node (NEGDIV) 154 does not vary due to current leakage.

The relatively high negative voltage is regulated to the predetermined erase voltage in the range of about −6 V to −7.7 V by the regulator circuit 14. The magnitude of the predetermined erase voltage within this range is dependent on the magnitude of the initializing voltage as previously set forth. The predetermined erase voltage is then directed to the decoder circuits 18. The decoder circuits 18 transfer the predetermined erase voltage to the wordlines 22 as previously set forth.

The application of the first and second back bias voltages to the enable voltage node (ENVR) 142 is not required during the embedded mode erase operation since z-device n-channel transistor 114 of the initializing circuit 34 maintains a sufficiently strong back bias. The predetermined reference voltage present on the voltage reference line (VREF) 100 maintains the strength of the back bias of z-device n-channel transistor 114. Continuous deactivation of the z-device n-channel transistor 114 maintains electrical isolation of the negative divider node (NEGDIV) 154 and the predetermined reference voltage during the erase operation.

The preferred embodiment of the present invention allows control of the predetermined erase voltage by variation of the predetermined variable voltage during the negative gate stress mode. Since the predetermined erase voltage depends on the initializing voltage present on the negative divider node (NEGDIV) 154, the relatively high negative voltage generated by the low-supply voltage negative charge pump 16 can be controlled. By switching from the predetermined reference voltage to the predetermined variable voltage during the negative gate stress mode, control of the magnitude of the predetermined erase voltage is possible.

Since the z-device n-channel transistors 116 and 118 that transfer voltage to the negative divider node (NEGDIV) 154 have the potential to leak current during the negative gate stress mode erase operation, the enable negative voltage node (ENVR) 142 is supplied a first and second back bias voltage. Due to the first and second back bias voltage, the magnitude of voltage on the negative divider node (NEGDIV) 154 remains at the desired initializing voltage. The characteristic of the z-device n-channel transistors 114, 116 and 118 that creates the potential for current leakage is not an issue during the embedded mode erase operation since z-device n-channel transistor 114 maintains a strong back bias.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of generating a predetermined erase voltage in a memory device, comprising:

generating a variable reference voltage with a reference voltage circuit, wherein said variable reference voltage is varied in a predetermined voltage range, said predetermined voltage range invariant with respect to supply potential;

directing said variable reference voltage to a regulator circuit;

generating a relatively high negative voltage with a low-supply voltage negative charge pump; and regulating said relatively high negative voltage with said regulator circuit to said predetermined erase voltage.

2. The method of claim 1, further comprising the step of transferring said predetermined erase voltage to at least one wordline.

3. The method of claim 1, further comprising the step of electrically isolating said reference voltage circuit from said regulator circuit after said variable reference voltage is directed to said regulator circuit.

4. The method of claim 1, wherein said variable reference voltage initializes said regulator circuit prior to an erase operation.

5. The method of claim 1, wherein said predetermined erase voltage is generated during a negative gate stress mode.

6. The method of claim 1, wherein said variable reference voltage is generated with an external power supply.

7. The method of claim 1, wherein said variable reference voltage is generated in a predetermined voltage range of about 0.7 to 1.2 V.

8. The method of claim 1, wherein said predetermined erase voltage is between about −6 V and −7.7 V.

9. A method of supplying a predetermined erase voltage to wordlines in a memory device, comprising:

generating a variable reference voltage with a reference voltage circuit, wherein said variable reference voltage is generated is varied in a predetermined voltage range, said predetermined voltage range invariant with respect to supply potential;

initializing a regulator circuit with said variable reference voltage;

generating a predetermined initializing voltage with said regulator circuit;

storing said predetermined initializing voltage in a plurality of capacitors;

generating a relatively high negative voltage with a low-supply voltage negative charge pump;

regulating said relatively high negative voltage with said regulator circuit to a predetermined erase voltage by discharging said predetermined initializing voltage from said plurality of capacitors; and transferring said predetermined erase voltage to at least one wordline with at least one decoder circuit.

10. The method of claim 9, further comprising the step of electrically isolating said reference voltage circuit from said regulator circuit after said variable reference voltage initializes said regulator circuit.

11. The method of claim 9, wherein said predetermined erase voltage is generated during a negative gate stress mode.

12. The method of claim 9, wherein said variable reference voltage is generated with an external power supply.

13. The method of claim 9, wherein said variable reference voltage is generated in a predetermined voltage range of about 0.7 to 1.2 V.

14. The method of claim 9, wherein said predetermined erase voltage is between about −6 V and −7.7 V.

15. The method of claim 9, wherein said regulator circuit includes an activation circuit, a one-shot circuit, an external voltage control circuit, an initializing circuit, a ratio circuit and a comparator circuit.

16. The method of claim 9, wherein said reference voltage circuit includes an external power supply and an internal reference voltage circuit.

17. A voltage regulation system for use during the erase in a memory device, comprising:

a low-supply voltage negative charge pump, wherein said low-supply voltage negative charge pump generates a relatively high negative voltage;

a regulator circuit electrically coupled with said low-supply voltage negative charge pump, wherein said regulator circuit regulates said relatively high negative voltage to a predetermined erase voltage; and a reference circuit electrically coupled with said regulator circuit, wherein said regulator circuit regulates said relatively high negative voltage to said predetermined erase voltage based on a variable reference voltage generated by said reference circuit, and wherein said variable reference voltage is generated is in a predetermined voltage range, said predetermined voltage range invariant with respect to supply potential.

18. The voltage regulation system of claim 17, wherein said predetermined erase voltage is transferred to at least one wordline.

19. The voltage regulation system of claim 17, wherein said predetermined erase voltage is generated during a negative gate stress mode.

20. The voltage regulation system of claim 17, wherein said variable reference voltage is generated with an external power supply.

21. The voltage regulation system of claim 17, wherein said variable reference voltage is generated in a predetermined voltage range of about 0.7 to 1.2 V.

22. The voltage regulation system of claim 17, wherein said predetermined erase voltage is between about −6 V and −7.7 V.

23. The voltage regulation system of claim 17, wherein said regulator circuit includes an activation circuit, a one-shot circuit, an external voltage control circuit, an initializing circuit, a ratio circuit, and a comparator circuit.

24. The voltage regulation system of claim 17, wherein said reference voltage circuit includes an external power supply and an internal voltage circuit.

* * * * *